United States Patent
Aigo et al.

(10) Patent No.: US 10,450,672 B2
(45) Date of Patent: Oct. 22, 2019

(54) METHOD FOR PRODUCING EPITAXIAL SILICON CARBIDE WAFERS

(71) Applicant: SHOWA DENKO K.K., Tokyo (JP)

(72) Inventors: Takashi Aigo, Tokyo (JP); Wataru Ito, Tokyo (JP); Tatsuo Fujimoto, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 39 days.

(21) Appl. No.: 15/323,655

(22) PCT Filed: Jul. 16, 2015

(86) PCT No.: PCT/JP2015/070456
§ 371 (c)(1),
(2) Date: Jan. 3, 2017

(87) PCT Pub. No.: WO2016/010126
PCT Pub. Date: Jan. 21, 2016

(65) Prior Publication Data
US 2017/0159208 A1  Jun. 8, 2017

(30) Foreign Application Priority Data
Jul. 16, 2014 (JP) ................. 2014-146304

(51) Int. Cl.
*C30B 25/18* (2006.01)
*C30B 25/14* (2006.01)
(Continued)

(52) U.S. Cl.
CPC ............ *C30B 25/186* (2013.01); *C30B 25/14* (2013.01); *C30B 25/165* (2013.01); *C30B 25/20* (2013.01);
(Continued)

(58) Field of Classification Search
CPC combination set(s) only.
See application file for complete search history.

(56) References Cited

U.S. PATENT DOCUMENTS

2007/0015333 A1* 1/2007 Kishimoto ........ H01L 21/02057
438/259
2012/0146056 A1  6/2012 Momose et al.
(Continued)

FOREIGN PATENT DOCUMENTS

EP          2472568 A1     7/2012
JP       2005-277229 A    10/2005
(Continued)

OTHER PUBLICATIONS

International Search Report, issued in PCT/JP2015/070456, dated Oct. 20, 2015.
(Continued)

*Primary Examiner* — Erin F Bergner
(74) *Attorney, Agent, or Firm* — Birch, Stewart, Kolasch & Birch, LLP

(57) ABSTRACT

The object is to produce with good reproducibility an epitaxial silicon carbide wafer having a high quality silicon carbide single crystal thin film with little step bunching. To achieve this object, for etching the silicon carbide single crystal substrate in the epitaxial growth furnace, hydrogen carrier gas and silicon-based material gas are used. After the etching treatment is finished as well, the epitaxial growth conditions are changed in the state in the state supplying these gases. When the conditions stabilize, a carbon-based material gas is introduced for epitaxial growth.

17 Claims, 5 Drawing Sheets

(51) Int. Cl.
*C30B 29/36* (2006.01)
*H01L 21/20* (2006.01)
*H01L 21/205* (2006.01)
*C30B 25/16* (2006.01)
*C30B 25/20* (2006.01)

(52) U.S. Cl.
CPC .............. *C30B 29/36* (2013.01); *H01L 21/20* (2013.01); *H01L 21/205* (2013.01)

(56) References Cited

U.S. PATENT DOCUMENTS

| | | |
|---|---|---|
| 2013/0029158 A1 | 1/2013 | Aigo et al. |
| 2013/0217213 A1 | 8/2013 | Aigo et al. |
| 2014/0264384 A1* | 9/2014 | Loboda .............. H01L 21/02529 257/77 |
| 2016/0168751 A1 | 6/2016 | Masumoto et al. |

FOREIGN PATENT DOCUMENTS

| | | |
|---|---|---|
| JP | 2006-111510 A | 4/2006 |
| JP | 2007-326743 A | 12/2007 |
| JP | 2011-219299 A | 11/2011 |
| JP | 2013-170104 A | 9/2013 |
| JP | 2014-189436 A | 10/2014 |
| KR | 10-2012-0046282 A | 5/2012 |
| WO | WO 2012/067112 A1 | 5/2012 |

OTHER PUBLICATIONS

Kojima et al., "Effect of additional Silane on in-situ H2 etching prior to 4H-SiC homoepitaxial growth", Materials Science Forum, ISSN: 1662-9752, Online: Sep. 15, 2007, vols. 556-557, pp. 85-88.
Written Opinion of the International Searching Authority, issued in PCT/JP2015/070456, dated Oct. 20, 2015.

* cited by examiner

METHOD FOR PRODUCING EPITAXIAL SILICON CARBIDE WAFERS

TECHNICAL FIELD

The present invention relates to a method for producing epitaxial silicon carbide wafers.

BACKGROUND ART

Silicon carbide (below, referred to as "SiC") is excellent in heat resistance and mechanical strength and is physically and chemically stable, so is gathering attention as an environmentally resistant semiconductor material. Further, in recent years, demand for epitaxial SiC wafers has been growing as substrates for high frequency, high withstand voltage electronic devices etc.

When using an SiC single crystal substrate (below, sometimes called an "SiC substrate") to fabricate a power device, high frequency device, etc., usually the SiC substrate is formed with an SiC thin film by epitaxial growth by the thermal CVD process (thermal chemical vapor deposition process) or is directly doped with a dopant by the ion implantation process. In the latter case, after implantation, high temperature annealing becomes necessary, so thin films are being frequently formed by epitaxial growth.

On SiC epitaxial films, triangular defects, carrot defects, comet defects, and other such epitaxial defects and other fine surface relief shapes, so-called "step bunching", are present. This step bunching occurs since when epitaxial growth proceeds due to step flow, since the speed of advance of the steps are not the same, fast steps catch up with slow steps and therefore the step heights become greater. If step bunching is present, for example, when forming an MOS device over it, the relief shapes at the interfaces of the oxide film and SiC will cause a drop in the mobility of the electrons and the device characteristics will decline. For this reason, to improve the characteristics and yield of the devices, it is necessary to also reduce this step bunching in the same way as epitaxial defects.

This step bunching clearly generally already occurs at the point of time of etching treatment of the SiC substrate performed before growth. Studies on the conditions of etching treatment not causing step bunching are underway. As one example, it is shown that by using a mixed gas of hydrogen and silane as the etching treatment gas, step bunching after the etching treatment can be greatly reduced compared with etching treatment using only hydrogen (see NPLT 1).

FIG. 1 shows the growth sequence by typical thermal CVD at the time of conventional epitaxial film growth together with the timings of introduction of the gases. First, an SiC substrate is set in an epitaxial growth furnace, the inside of the epitaxial growth furnace is evacuated, then a carrier gas of hydrogen is introduced and the pressure is adjusted to $2 \times 10^3$ to $2 \times 10^4$ Pa. After that, the pressure is maintained constant while raising the temperature of the epitaxial growth furnace. After reaching 1550 to 1600° C. or so, $SiH_4$ is introduced to start the etching treatment (in state supplying carrier gas of hydrogen). The flow rate of $SiH_4$ at this time is 1 to 2 $cm^3$ per minute, while the flow rate of the carrier gas of hydrogen is 100 to 200 liters per minute. After the end of the etching treatment, the temperature of the epitaxial growth furnace is changed to the epitaxial growth temperature of 1600 to 1650° C. or so, but during that time, the introduction of $SiH_4$ is stopped. After the temperature of the epitaxial growth furnace stabilizes, the silicon-based material gas $SiH_4$ is again introduced and simultaneously the carbon-based material gas $C_3H_8$ and doping gas $N_2$ are introduced to start the epitaxial growth. The flow rate of $SiH_4$ at this time is 100 to 150 $cm^3$ per minute, the flow rate of $C_3H_8$ is 50 to 70 $cm^3$ per minute (the C/Si ratio is 1.0 to 2.0 or so), and the speed of epitaxial growth is 10 μm per minute or so. This speed of epitaxial growth was determined considering productivity since the film thickness of the epitaxial layer usually used is 10 μm or so. When the desired film thickness has been obtained, the introduction of $SiH_4$, $C_3H_8$, and $N_2$ is stopped and only hydrogen gas is supplied. In this state, the temperature is lowered. After the temperature falls to ordinary temperature, the introduction of hydrogen gas is stopped, the inside of the epitaxial growth chamber is evacuated, inert gas is introduced into the epitaxial growth chamber and the epitaxial growth chamber is returned to atmospheric pressure, then the SiC substrate is taken out.

However, even if using the above mixed gas of hydrogen and silane, with the conventional method, step bunching was observed to occur with a considerable frequency after epitaxial growth. Instability of the surface conditions after etching treatment is suggested. Therefore, attempts have further been made to suppress step bunching. PLT 1 proposes to introduce trichlorosilane or another silicon-chlorine-based gas into the mixed gas of hydrogen and silane. This discloses that if silane breaks down, various types of compounds would be produced, but in the case of a silicon-chlorine-based gas, even if it breaks down, it forms $SiCl_2$ and therefore a stable etching speed is obtained. PLT 2 discloses the art of controlling the Si/C ratio in the film formation to suppress the atomic steps. At the start of film formation from the etching at this time, it is proposed to maintain the Si/C ratio constant. PLT 3 discloses the art of making the depth of etching by hydrogen etching a constant value (1 nm) or less so as to suppress giant step bunching (GSB) due to basal plane dislocation (BPD). At this time, it is proposed to instantaneously switch between the etching process and the process for forming the epitaxial growth layer. Specifically, it has been proposed to introduce the material gas for epitaxial growth substantially simultaneously with stopping the introduction of the etching gas or to continue the introduction of the etching gas and in that state additionally introduce a gas required for forming the epitaxial growth layer as a material gas. Therefore, in epitaxial SiC wafers, for which application to devices is expected in the future, unless stabilizing the surface conditions after the etching treatment and stably reducing step bunching after epitaxial growth, it was difficult to prepare electronic devices with excellent characteristics with a high yield.

CITATION LIST

Patent Literature

PLT 1. International Publication No. WO2012/67112A
PLT 2. Japanese Patent Publication No. 2007-326743A
PLT 3. Japanese Patent Publication No. 2014-189436A

Nonpatent Literature

NPLT 1. K. Kojima et al.: Materials Science Forum, Vols. 556-557 (2007), pp 85-88.

SUMMARY OF INVENTION

Technical Problem

As art for suppressing step bunching, for example, there are the arts disclosed in PLTs 1 to 3. It is reported that certain effects are exhibited. However, in the art described in PLT 1, trichlorosilane or other silicon-chlorine-based gas is introduced into the etching gas. While this contributes to the stabilization of etching, it does not lead to stable reduction of step bunching. Further, in the art described in PLT 2, the epitaxial growth is started right in the middle of fluctuation of the epitaxial growth conditions, so variation occurs between batches in the effect of reduction of step bunching and reproducibility cannot be obtained. PLT 3 proposes to instantaneously switch between the etching process and epitaxial growth process, but this is not realistic. It discloses to continue supplying the etching gas at the time of switching and additionally introducing gas required for forming the epitaxial growth layer as a material gas, but in the same way as PLT 2, the epitaxial growth is started right in the middle of fluctuation of the epitaxial growth conditions, so variation occurs in the effect of reduction of step bunching between batches and reproducibility cannot be obtained. As explained above, even with these arts, step bunching is not stably reduced. Further, variations occur between batches so there was the problem that reproducibility could not be obtained. On the other hand, device technologies are becoming increasingly advanced. Much stabler reduction of step bunching is being sought. The present invention has as its object the production of an epitaxial SiC wafer suppressing step bunching without accompanying major remodeling of the facilities and giving a high quality epitaxial film (SiC single crystal thin film) with good reproducibility. Note that, in the present invention, the surface roughness Ra is used as an indicator of step bunching. A surface roughness Ra of 1.0 nm or less is targeted.

Solution to Problem

The inventors engaged in intensive studies for solving the above problem and as a result obtained the following discoveries.

(a)
In the past, after finishing the etching, the carrier gas comprised of hydrogen gas (below, called the "hydrogen carrier gas") continued to be supplied, but the supply of material gas was stopped and the furnace temperature, pressure, or other conditions for epitaxial growth (below, called the "epitaxial growth conditions") was changed. After the epitaxial growth conditions stabilized, the material gas for epitaxial growth was introduced and epitaxial growth was started. The period from the end of the etching to the start of the epitaxial growth usually was 5 to 10 minutes. During that time, the surface conditions of the clean SiC substrate formed by etching end up being degraded. It was discovered that this was one of the causes behind poor reproducibility of reduction of step bunching.

(b)
Therefore, the inventors discovered that by supplying hydrogen carrier gas and silicon-based material gas to perform etching treatment of the SiC substrate before epitaxial growth and, when changing the flow rate of gas to the growth process, temperature, pressure, and other epitaxial growth conditions from the etching treatment process, continuing to supply silicon-based material gas and hydrogen carrier gas until the conditions finish stabilizing and introducing the carbon-based material gas to start the growth after the conditions stabilize, it is possible to stably grow an epitaxial film reduced in step bunching. Due to this, it is possible to maintain the SiC substrate with stable low surface energy while starting the epitaxial growth, so not only is step bunching suppressed, but also variation between batches is reduced and a stable, high quality epitaxial SiC wafer can be obtained. Note that, the "epitaxial growth conditions" mean at least one of mainly the epitaxial growth temperature, epitaxial growth pressure, flow rate of hydrogen carrier gas, flow rate of silicon-based material gas, and flow rates of different carbon-based material gases. Further, "changing the epitaxial growth conditions" means changing from the conditions at the time of the etching treatment to the conditions at the time of epitaxial growth.

(c)
Further, the above discovery confirmed that even when introducing trichlorosilane or other silicon-chlorine-based gas to the etching gas, a similar effect can be obtained. The present invention was made based on the above discovery and has as its gist the following:

That is, the present invention provides:

[1]
A method for producing epitaxial silicon carbide wafers which epitaxially grows silicon carbide by a thermal CVD process on a silicon carbide single crystal substrate in an epitaxial growth furnace, the method for producing epitaxial silicon carbide wafers comprising introducing into the epitaxial growth furnace a carrier gas comprised of hydrogen gas and a silicon-based material gas in an amount of $10^{-4}$ vol % to $10^{-2}$ vol % with respect to the carrier gas, etching the surface of the silicon carbide single crystal substrate to over 0.05 µm to 0.5 µm, then changing an epitaxial growth condition in the epitaxial growth furnace while feeding the carrier gas and the silicon-based material gas, and further supplying a carbon-based material gas while feeding the carrier gas and the silicon-based material gas after the epitaxial growth condition stabilizes to thereby start epitaxial growth of silicon carbide.

[2]
The method for producing epitaxial silicon carbide wafers according to [1] wherein the epitaxial growth condition is at least one of an epitaxial growth temperature, epitaxial growth pressure, flow rate of carrier gas, flow rate of siliconbased material gas, or flow rate of carbon-based material gas.

[3]
The method for producing epitaxial silicon carbide wafers according to [1] or [2] where the silicon-based material gas is one or a mixed gas of two or more of a silane, a chlorosilane-based material gas, and silicon tetrachloride gas.

[4]
The method for producing epitaxial silicon carbide wafers according to any one of [1] to [2] wherein the carbon-based material gas is one or a mixed gas of two or more of $C_3H_8$ gas, $C_2H_4$ gas, and $CH_4$ gas.

[5]
The method for producing epitaxial silicon carbide wafers according to any one of [1] to [4] wherein a surface roughness Ra of the surface of the obtained epitaxial silicon carbide wafer is 1.0 nm or less.

[6]
The method for producing epitaxial silicon carbide wafers according to any one of [1] to [5] wherein the silicon carbide single crystal substrate has an off angle to the <11-20> direction with respect to the (0001) face of 4° or less.

Advantageous Effects of Invention

According to the present invention, it is possible to stably provide an epitaxial SiC wafer having a high quality epitaxial film further reduced in step bunching compared with the past Further, the method of production of the present invention uses thermal CVD, so the hardware configuration is easy, the controllability is also excellent, and an epitaxial film with a high uniformity and reproducibility can be obtained. Furthermore, it is possible to greatly utilize existing epitaxial growth furnaces without major remodeling.

Furthermore, if using the epitaxial SiC wafer of the present invention, it is possible to form devices on a high quality epitaxial film reduced in step bunching, so the characteristics and yield are improved.

DESCRIPTION OF EMBODIMENTS

Below, the present invention will be described in detail. As explained in FIG. 1, in the past, a carrier gas comprised of hydrogen gas and a silicon-based material gas were introduced and the surface of the 1550 to 1600° C. silicon carbide single crystal substrate was etched, then hydrogen gas was continued to be supplied while stopping the introduction of the Silicon-based material gas. While the hydrogen carrier gas continued to be supplied, the temperature and pressure inside the furnace were changed to the temperature and pressure of epitaxial growth. Further, the silicon-based and carbon-based material gases were introduced to start epitaxial growth after the temperature and pressure stabilized. Therefore, in the period from the end of the etching treatment to the start of the epitaxial growth (in general 5 to 10 minutes), the silicon carbide single crystal substrate was in an approximately 1600° C. atmosphere, so the surface conditions of the highly clean SiC substrate formed by the etching treatment ended up being disturbed and therefore step bunching could not be reduced with good reproducibility.

Therefore, the present invention is characterized by maintaining the introduction of the hydrogen carrier gas and the silicon-based material gas from the end of the etching treatment to the start of epitaxial growth and by maintaining the surface of the SiC substrate with stable low surface energy while starting epitaxial growth after the epitaxial growth conditions stabilize. Using this method, it is possible to reduce step bunching with good reproducibility.

The specific content of the present invention will first be explained in relation to epitaxial growth on a SiC substrate. The apparatus used for the epitaxial growth (epitaxial growth furnace) is a thermal CVD apparatus. The CVD process is simple in hardware configuration and enables the film thickness in the epitaxial growth to be controlled by turning the gas on/off, so is a method of growth excellent in controllability and reproducibility of the epitaxial film.

Figure 1:
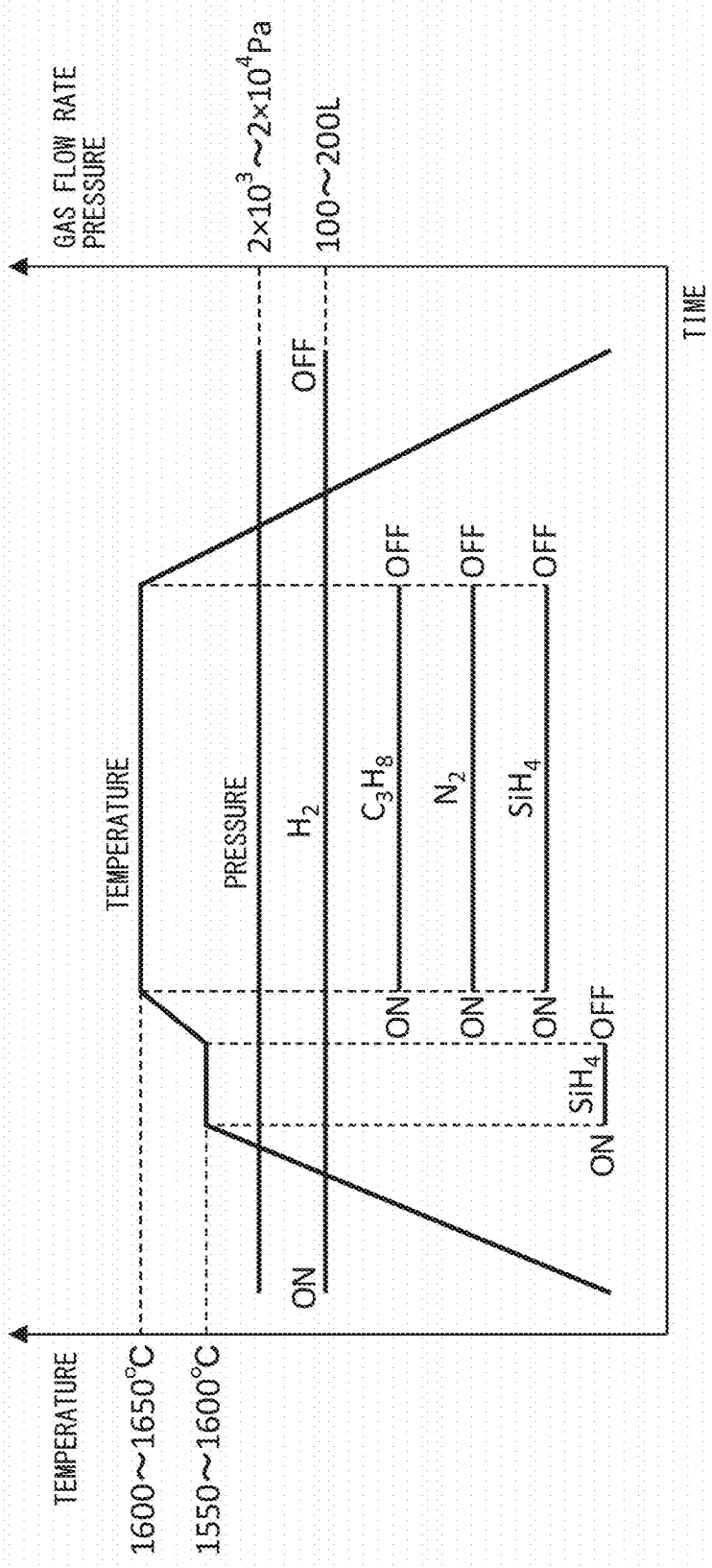
FIG. 1 is a view showing a typical growth sequence when performing conventional epitaxial growth.
Figure 2:
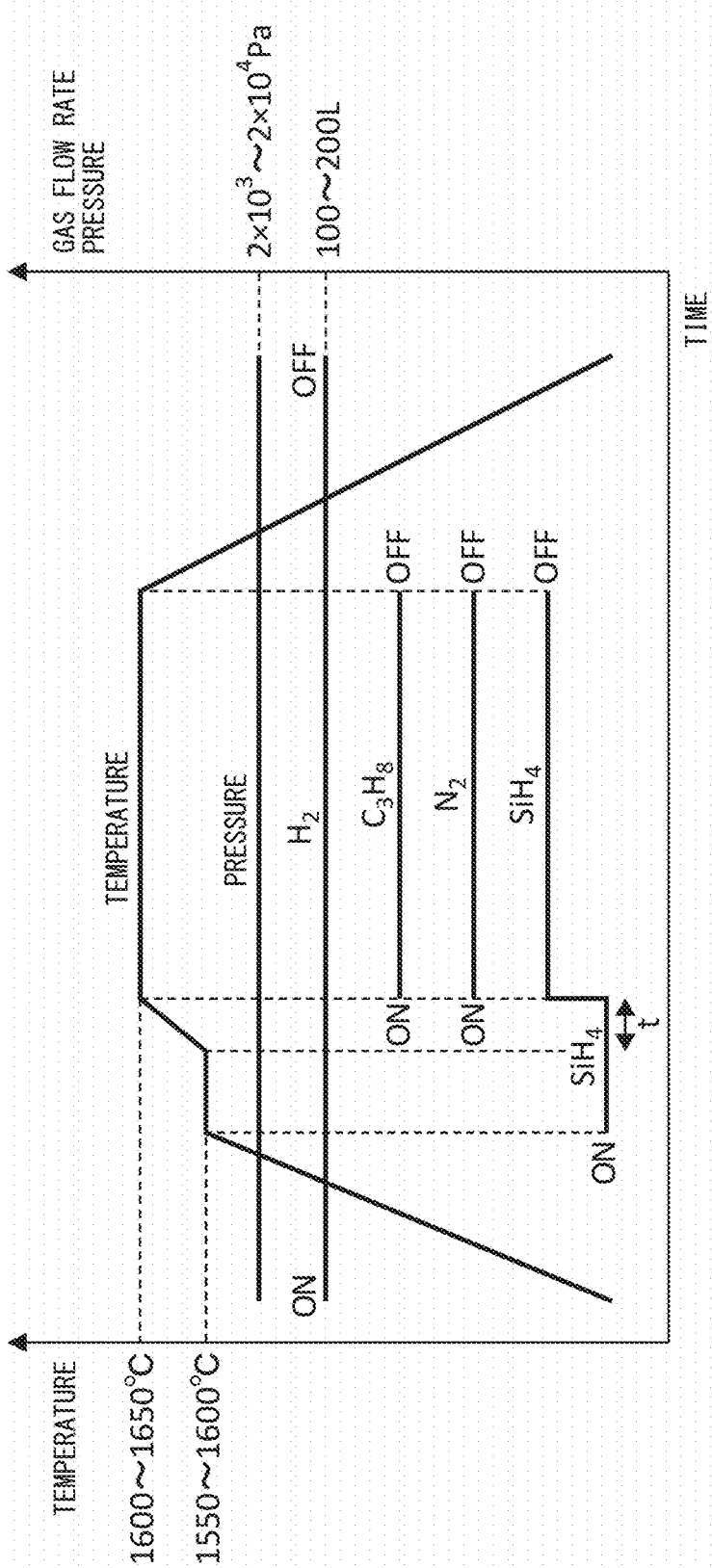
FIG. 2 is a view showing a typical growth sequence when performing epitaxial growth according to one method of the present invention.

In the present invention, one example of the sequence when performing epitaxial film growth is shown in FIG. 2. This sequence shows the case of changing the epitaxial growth temperature from the conditions of the etching treatment when starting the epitaxial growth. First, in the same way as the prior art such as shown in FIG. 1, an SiC substrate is set inside the epitaxial growth furnace, the inside of the epitaxial growth furnace is evacuated, then hydrogen carrier gas is introduced and the pressure is adjusted to $2 \times 10^3$ to $2 \times 10^4$ Pa. After this, the pressure is maintained constant while raising the temperature of the epitaxial growth furnace. After reaching 1550 to 1600° C. or so, $SiH_4$ is introduced and etching treatment is started (in state supplying hydrogen carrier gas). The $SiH_4$ flow rate at this time is 1 to 2 cm$^3$ per minute and the carrier gas flow rate of the hydrogen is 100 to 200 liters per minute. After the etching treatment ends, the temperature is changed to the epitaxial growth temperature of 1600 to 1650° C. or so, but during that time (time "t"), $SiH_4$ continues to be supplied. In that state, it is waited until the temperature stabilizes (in this example of the sequence, 5 to 10 minutes or so). After the temperature stabilizes, $SiH_4$ is already being supplied, but if necessary, the flow rate is adjusted and $C_3H_8$ and the doping gas $N_2$ are introduced to start the epitaxial growth. The rest of the process is similar to the conventional method shown in FIG. 1. In this way, after the etching treatment of the SiC substrate, the temperature or other condition inside the epitaxial growth furnace is adjusted (changed) to the epitaxial growth conditions. At this time, $SiH_4$ or other such silicon-based material gas continues to be supplied so as to maintain the stable surface conditions characteristic of the etching treatment using $SiH_4$. For this reason, it is possible to perform epitaxial growth as is in the clean surface conditions of the SiC substrate. As a result, it is possible to stably reduce step bunching at the surface of the epitaxial film where epitaxial growth has finished.

In etching treatment using $SiH_4$, in general, the surface energy of the SiC substrate falls, so step bunching of the subsequent etching treatment can be reduced. Furthermore, when starting epitaxial growth, step flow is easily promoted, so due to the two effects, it may be considered there is an effect of suppression of step bunching after epitaxial growth. However, the etching treatment conditions and epitaxial growth conditions differ in temperature, pressure, flow rates of different gases, and other process conditions in many respects. When changing conditions from etching treatment to epitaxial growth, time is required for changing the conditions and stabilization (corresponding to time "t" shown in FIG. 2). In the prior art, during the time for changing the conditions and stabilization, the hydrogen carrier gas continued to be supplied while the $SiH_4$ was stopped so as to maintain the surface conditions formed by the etching treatment. However, the inventors discovered that continuing to supply $SiH_4$ even during that time is effective for stably maintaining the surface conditions of the SIC and leads to suppression of step bunching with good reproducibility.

In the above-mentioned example, as the epitaxial growth condition, temperature was used as an example for the explanation but as the epitaxial growth condition, when starting the epitaxial growth of SiC, one or more of the epitaxial growth temperature, epitaxial growth pressure, flow rate of hydrogen carrier gas, or flow rate of each of the silicon-based and carbon-based material gases may be changed from the conditions at the time of the etching treatment. The time "t" required for changing a condition from the etching treatment to the start of epitaxial growth and stabilization is about 1 to 2 minutes when changing the flow rates of the carrier gas and different materials. Further, when changing the epitaxial growth temperature, it is about 5 to 10 minutes or so. When changing the epitaxial growth pressure, it is about 3 to 5 minutes. Note that, here, the "epitaxial growth conditions stabilizing" means the different conditions (temperature, pressure, flow rate, etc.) converging to predetermined target values. For example, the fluctuation in 1 minute may be within ±3% of the target value. Preferably, it is within ±1%. If so, the conditions are judged stable.

To enable the silicon-based material gas in the etching treatment to become $10^{-4}$ vol % to $10^{-2}$ vol % (1E-4 vol % to 1E-2 vol %) with respect to the carrier gas, the carrier gas and silicon-based material gas may be introduced into the epitaxial growth furnace. If the silicon-based material gas is smaller than $10^{-4}$ vol % with respect to the carrier gas, the effect of reduction of the surface energy of the SiC substrate by the etching treatment becomes smaller. On the other hand, if greater than $10^{-2}$ vol %, the occurrence of Si droplets due to the high concentration of the silicon-based material gas becomes a problem.

Note that, in the above explanation, $SiH_4$ was used for the silicon-based material gas, while $C_3H_8$ was used for the carbon-based material gas, but the invention does not particularly have to be limited to these. As the silicon-based material gas, silane ($SiH_4$, also called "monosilane"), disilane ($Si_2H_6$), trisilane ($Si_3H_8$), and other silane-based gases and trichlorosilane, tetrachlorosilane, and other chlorosilane-based gases, and silicon tetrachloride gas can be used. Of course, a silane-based gas, chlorosilane-based gas, and silicon tetrachloride gas as single types or mixed gases of two types or more may also be used. As the carbon-based material gas, $C_3H_8$, $C_2H_4$, $CH_4$, or another hydrocarbon compound gas can be used. Note that, in the example of the sequence of FIG. 2, $N_2$ is used as the n-type doping gas, but it is also possible to use a gas containing B or Al as p-type doping. Alternatively, it is also possible to perform epitaxial growth without introducing doping gas.

Furthermore, the etching treatment is used to etch the surface of the SiC substrate to over 0.05 μm to 0.5 μm, preferably 0.1 μm to 0.5 μm. This is because if the amount of etching becomes 0.05 μm or less, removal of the abraded layer of the SiC substrate surface becomes insufficient, so step bunching and epitaxial defects end up becoming easily induced. Conversely, if larger than 0.5 μm, the etching becomes excessive and the surface roughness increases.

In this regard, for evaluation of step bunching, in general, the surface roughness Ra is used. If there is no step bunching, Ra is 0.3 to 0.5 nm. If over about two times this value, the step bunching becomes remarkable. Therefore, preferably, the surface roughness Ra of the surface of the epitaxial SiC wafer should be kept down to 1.0 nm or less. Note that, the surface roughness Ra is the arithmetic average roughness based on JIS B0601:2001. Preferably, it is 0.8 nm or less, more preferably 0.6 nm or less.

In producing an epitaxial SiC wafer, the smaller the value of the off angle of the SiC substrate, the larger the yield from an ingot and therefore the more advantageous. If the off angle is too small, the step density of the surface decreases and the terrace width increases, so step flow growth is inhibited and step bunching and epitaxial defects increase. Considering these, at the present, a 4 degree off angle has become the mainstream. To sufficiently obtain the advantageous effects of the present invention, the off angle of slant to the <11-20> direction with respect to the (0001) plane should be 4 degrees or less, more preferably the off angle is 0.5 to 4 degrees. That is, according to the present invention, in an epitaxial film on an SiC substrate having a 4° or less off angle, a high quality with little step bunching can be stably obtained.

The devices suitably formed on the epitaxial SiC wafer epitaxially grown in this way are not particularly limited, but, for example, include Schottky barrier diodes, PIN diodes, MOS diodes, MOS transistors, and other such devices in particular used for power control.

EXAMPLES

Below, examples and comparative examples will be used as the basis to explain the method of producing epitaxial SiC wafers by epitaxially growing an SiC film on an SiC single crystal substrate. Note that the present invention is not limited to the following content.

Example 1

From a 4 inch (100 mm) wafer-use SiC single crystal ingot, a thickness of about 400 μm was sliced. This was rough ground and normally polished by a diamond abrasive and finally polished by CMP (chemical mechanical polishing) to obtain an SiC single crystal substrate. Epitaxial growth was performed on the Si surface of this SiC single crystal substrate. Here, the poly type of the SiC single crystal substrate was 4H. Further, the off angle of the SiC single crystal substrate slanted in the <11-20> direction with respect to the (0001) plane was 4° (in the following examples and comparative examples, the off direction of the off angle being the same as this).

As the procedure of the epitaxial growth, an SiC single crystal substrate was set in a thermal CVD epitaxial growth furnace, the inside of the epitaxial growth furnace was evacuated, then hydrogen carrier gas was introduced at 150 liters per minute while adjusting the pressure to $3\times10^3$ Pa. After that, the pressure was maintained constant while raising the temperature of the epitaxial growth furnace to 1630° C. When the temperature stabilized, $SiH_4$ (silicon-based material gas) was introduced at a flow rate of 15 cm$^3$ per minute to start the etching treatment. At this time, the hydrogen carrier gas continued to be supplied and the ratio of the $SiH_4$ to the hydrogen carrier gas was made $10^{-2}$ vol %. Further, the etching time was made 60 minutes. The amount of etching of the surface of the SiC single crystal substrate due to this etching treatment was 0.2 μm. Note that the amount of etching can be adjusted by the etching time. The etching speed is found in advance by measurement of the thickness using the FTIR (Fourier Transform Infrared Spectroscopy) method.

After the etching treatment, the hydrogen carrier gas and $SiH_4$ gas were supplied without changing the flow rates while the temperature of the epitaxial growth furnace was raised to 1650° C. When the temperature stabilized, the flow rate of the $SiH_4$ gas was changed to 125 cm$^3$ per minute and simultaneously the flow rate of $C_3H_8$ (carbon-based material gas) was made 54 cm$^3$ per minute and the flow rate of $N_2$ (doping gas) was made 30 cm$^3$ per minute to introduce these into the epitaxial growth furnace and start the epitaxial growth on the SiC single crystal substrate. At this time, the time from the end of etching to the start of epitaxial growth was about 3 minutes. Further, after the epitaxial layer was grown to 10 μm, the introduction of $SiH_4$, $C_3H_8$, and $N_2$ was stopped and only hydrogen gas was supplied. In that state, the temperature was lowered. After lowering the temperature to ordinary temperature, the introduction of hydrogen gas was stopped, the inside of the epitaxial growth chamber was evacuated, inert gas was introduced into the epitaxial growth chamber and the epitaxial growth chamber was returned to atmospheric pressure, then the SiC single crystal substrate was taken out.

Figure 3:
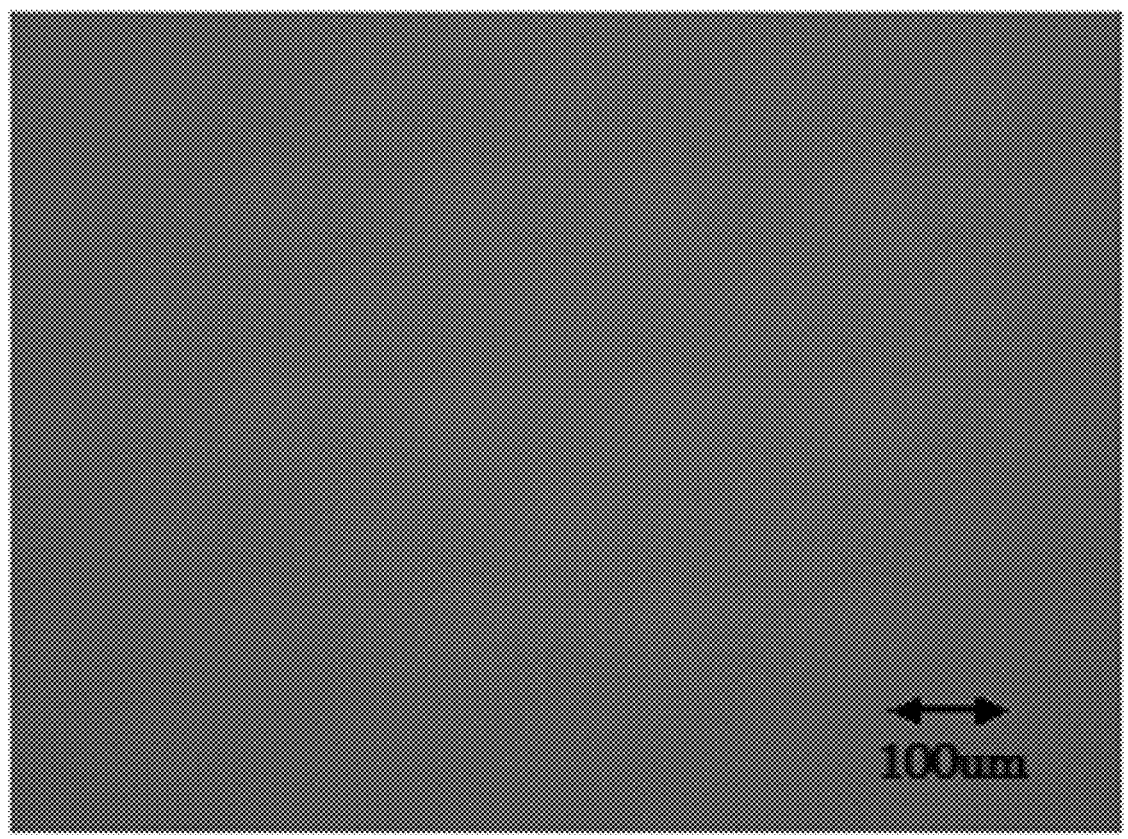
FIG. 3 is an optical micrograph showing surface conditions of a film epitaxially grown by one method of the present invention.

An optical micrograph of the film obtained by epitaxial growth in this way is shown in FIG. 3. From FIG. 3, it will be understood that a good film with little step bunching is obtained. Further, the surface roughness Ra was a small 0.4 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 2

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the flow rate of the $SiH_4$ at the time of the etching treatment was made 1.5 cm$^3$ per minute (ratio of $SiH_4$ to hydrogen carrier gas was $10^{-3}$ vol %), while the amount of etching by the etching treatment was made 0.2 μm (etching time 40 minutes). The rest of the epitaxial growth procedure, gas flow rate, temperature, etc. were similar to Example 1, while the epitaxial growth film thickness was 10 μm. The surface roughness Ra of the film epitaxially grown in this way was a small 0.5 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 3

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the flow rate of the $SiH_4$ at the time of the etching treatment was made 0.15 cm$^3$ per minute (ratio of $SiH_4$ to hydrogen carrier gas was $10^{-4}$ vol %), while the amount of etching by the etching treatment was made 0.2 μm (etching time 30 minutes). The rest of the epitaxial growth procedure, gas flow rate, temperature, etc. were similar to Example 1, while the epitaxial growth film thickness was 10 μm. The surface roughness Ra of the film epitaxially grown in this way was a small 0.7 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 4

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the flow rate of the $SiH_4$ at the time of the etching treatment was made 15 cm$^3$ per minute (ratio of $SiH_4$ to hydrogen carrier gas was $10^{-2}$ vol %), while the amount of etching by the etching treatment was made 0.1 μm (etching time 30 minutes). The rest of the epitaxial growth procedure, gas flow rate, temperature, etc. were similar to Example 1, while the epitaxial growth film thickness was 10 μm. The surface roughness Ra of the film epitaxially grown in this way was a small 0.6 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 5

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the flow rate of the $SiH_4$ at the time of the etching treatment was made 15 cm$^3$ per minute (ratio of $SiH_4$ to hydrogen carrier gas was $10^{-2}$ vol %), while the amount of etching by the etching treatment was made 0.5 μm (etching time 150 minutes). The rest of the epitaxial growth procedure, gas flow rate, temperature, etc. were similar to Example 1, while the epitaxial growth film thickness was 10 μm. The surface roughness Ra of the film epitaxially grown in this way was a small 0.5 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 6

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 2°. The procedure of the etching treatment was similar to Example 1, but the flow rate of the $SiH_4$ at the time of the etching treatment was made 15 cm$^3$ per minute (ratio of $SiH_4$ to hydrogen carrier gas was $10^{-2}$ vol %), while the amount of etching by the etching treatment was made 0.2 μm (etching time 60 minutes). The rest of the epitaxial growth procedure, gas flow rate, temperature, etc. were similar to Example 1, while the epitaxial growth film thickness was 10 μm. The surface roughness Ra of the film epitaxially grown in this way was a small 0.8 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 7

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 0.5°. The procedure of the etching treatment was similar to Example 1, but the flow rate of the $SiH_4$ at the time of the etching treatment was made 15 cm$^3$ per minute (ratio of $SiH_4$ to hydrogen carrier gas was $10^{-2}$ vol %), while the amount of etching by the etching treatment was made 0.2 μm (etching time 60 minutes). The rest of the epitaxial growth procedure, gas flow rate, temperature, etc. were similar to Example 1, while the epitaxial growth film thickness was 10 μm. The surface roughness Ra of the film epitaxially grown in this way was a small 0.9 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 8

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but instead of $SiH_4$, $SiHCl_3$ was used and the flow rate of the $SiHCl_3$ at the time of the etching treatment was made 15 cm$^3$ per minute (ratio of $SiHCl_3$ to hydrogen carrier gas was $10^{-2}$ vol %), while the amount of etching by the etching treatment was made 0.2 μm (etching time 60 minutes). The rest of the epitaxial growth procedure, gas flow rate, temperature, etc. were similar to Example 1, while the epitaxial growth film thickness was 10 μm. the surface roughness Ra of the film epitaxially grown in this way was a small 0.5 nm. This is a result of continuing to supply $SiHCl_3$ even after the end of the etching treatment while proceeding to the epitaxial growth process. Due to this, the surface of the SiC substrate remains held in a stable state of low surface energy while epitaxial growth is started and therefore step bunching is reduced.

Example 9

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but instead of $SiH_4$, $SiCl_4$ was used and the flow rate of the $SiCl_4$ at the time of the etching treatment was made 15 cm$^3$ per minute (ratio of $SiCl_4$ to hydrogen carrier gas was $10^{-2}$ vol %), while the amount of etching by the etching treatment was made 0.2 μm (etching time 60 minutes). The rest of the epitaxial growth procedure, gas flow rate, temperature, etc. were similar to Example 1, while the epitaxial growth film thickness was 10 μm. The surface roughness Ra of the film epitaxially grown in this way was a small 0.45 nm. This is a result of continuing to supply $SiCl_4$ even after the end of the etching treatment while proceeding to the epitaxial growth process. Due to this, the surface of the SiC substrate remains held in a stable state of low surface energy while epitaxial growth is started and therefore step bunching is reduced.

Example 10

Figure 4:
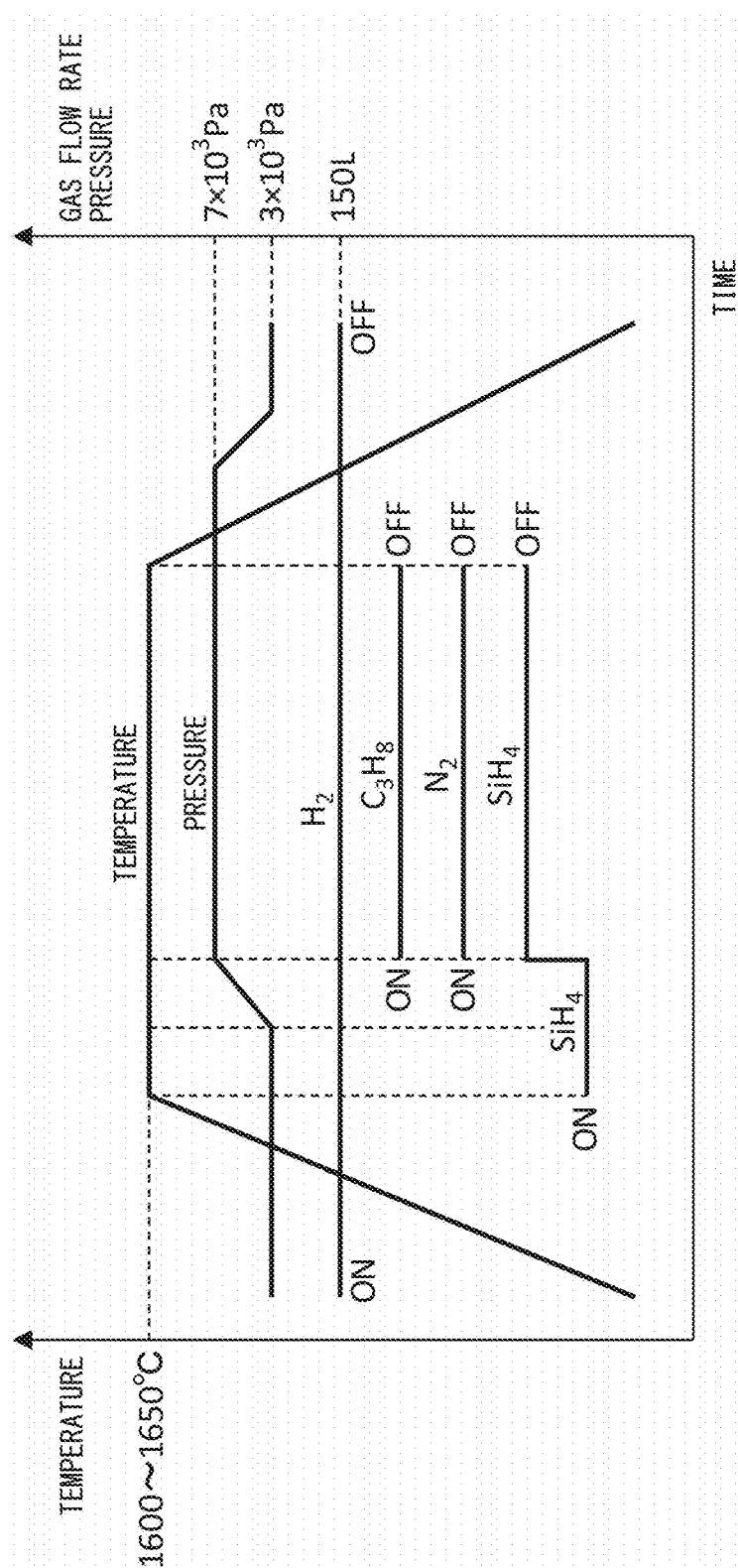
FIG. 4 is a view showing a typical growth sequence when performing epitaxial growth according to another method of the present invention.

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. In Examples 1 to 9, as the condition for starting epitaxial growth, the epitaxial temperature was changed, but in this example, the epitaxial pressure was changed. The epitaxial growth sequence in this case is shown in FIG. 4.

As the procedure of the epitaxial growth, an SiC single crystal substrate was set in an epitaxial growth furnace, the inside of the epitaxial growth furnace was evacuated, then hydrogen carrier gas was introduced at 150 liters per minute while adjusting the pressure to $3\times10^3$ Pa. After that, the pressure was maintained constant while raising the temperature of the epitaxial growth furnace to 1630° C. When the temperature stabilized, $SiH_4$ was introduced at a flow rate of 15 cm$^3$ per minute to start the etching treatment. The ratio of the $SiH_4$ to the hydrogen carrier gas was made $10^{-2}$ vol %, while the amount of etching by the etching treatment was made 0.2 μm (etching time 60 minutes).

After the etching treatment, without changing the temperature and without changing the flow rate, $SiH_4$ was supplied while raising the pressure to $7\times10^3$ Pa. When the pressure stabilized, the flow rate of $SiH_4$ was changed to 125 cm$^3$ per minute and, simultaneously, the flow rate of $C_3H_8$ was changed to 54 cm$^3$ per minute and the flow rate of $N_2$ was changed to 30 cm$^3$ per minute to introduce these to the epitaxial growth furnace to start the epitaxial growth. At this time, the time from the end of etching to the start of epitaxial growth was about 3 minutes. The rest of the procedure and the epitaxial growth film thickness were similar to Example 1. The surface roughness Ra of the film epitaxially grown in this way was a small 0.55 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 11

Figure 5:
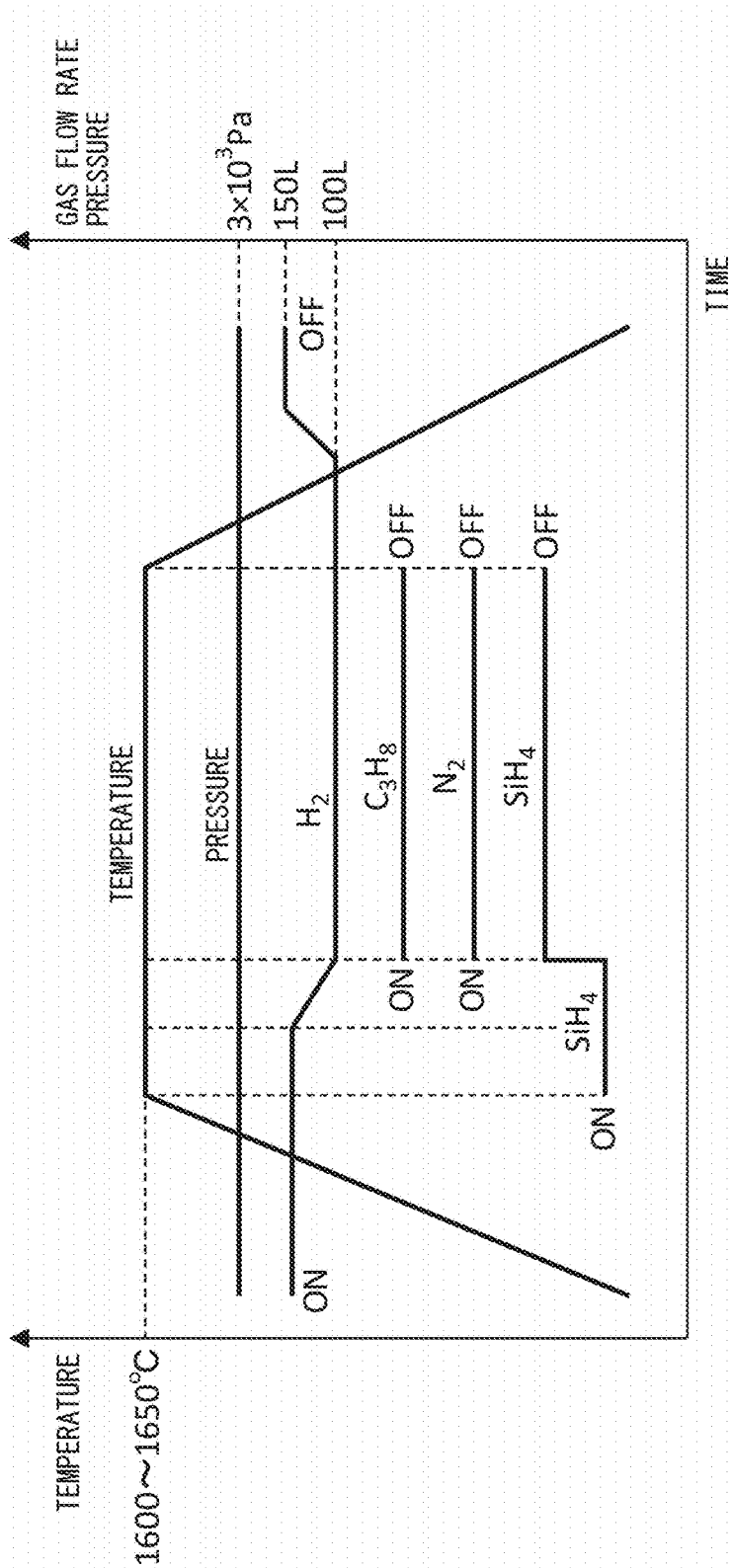
FIG. 5 is a view showing a typical growth sequence when performing epitaxial growth according to still another method of the present invention.

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. In this example, as the condition for start of epitaxial growth, the flow rate of carrier gas was changed. The epitaxial growth sequence in this case is shown in FIG. 5.

As the procedure of the epitaxial growth, a substrate was set in an epitaxial growth furnace, the inside of the epitaxial growth furnace was evacuated, then hydrogen carrier gas was introduced at 150 liters per minute while adjusting the pressure to $3\times10^3$ Pa. After that, the pressure was maintained constant while raising the temperature of the epitaxial growth furnace to 1630° C. When the temperature stabilized, $SiH_4$ was introduced at a flow rate of 15 cm$^3$ per minute to start the etching treatment. The ratio of the $SiH_4$ to the hydrogen carrier gas was made $10^{-2}$ vol %, while the amount of etching by the etching treatment was made 0.2 μm (etching time 60 minutes).

After the etching treatment, without changing the temperature and without changing the flow rate, $SiH_4$ was supplied while lowering the flow rate of the hydrogen carrier gas to 100 liters per minute. When the amount of flow of the carrier gas stabilized, the flow rate of $SiH_4$ was changed to 125 cm³ per minute and, simultaneously, the flow rate of $C_3H_8$ was changed to 54 cm³ per minute and the flow rate of $N_2$ was changed to 30 cm³ per minute to introduce these to the epitaxial growth furnace to start the epitaxial growth. At this time, the time from the end of etching to the start of epitaxial growth was about 4 minutes. The rest of the procedure and the epitaxial growth film thickness were similar to Example 1. The surface roughness Ra of the film epitaxially grown in this way is as a small as 0.6 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Example 12

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 0°. The procedure of the etching treatment was similar to Example 1, but the $SiH_4$ flow rate at the time of the etching treatment was made 15 cm³ per minute (ratio of $SiH_4$ with respect to hydrogen carrier gas of $10^{-2}$ vol %), and the amount of etching by the etching treatment was 0.2 μm (etching time 60 minutes). The rest of the epitaxial growth procedure, gas flow rate, temperature, etc. were similar to Example 1. The epitaxial growth film thickness was 10 μm. The surface roughness Ra of the film epitaxially grown in this way was a small 0.98 nm. This is a result of continuing to supply $SiH_4$ even after the end of the etching treatment while proceeding to the epitaxial growth process. Due to this, the surface of the SiC substrate remains held in a stable state of low surface energy while epitaxial growth is started and therefore step bunching is reduced.

Comparative Example 1

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the $SiH_4$ flow rate at the time of the etching treatment was made 15 cm³ per minute (ratio of $SiH_4$ with respect to hydrogen carrier gas of $10^{-2}$ vol %), and the amount of etching by the etching treatment was 0.2 μm (etching time 60 minutes). After the etching treatment, the introduction of $SiH_4$ was stopped and only hydrogen carrier gas was supplied. In that state, the temperature of the epitaxial growth furnace was raised to 1650° C. When the temperature stabilized, $SiH_4$, $C_3H_8$, and $N_2$ were supplied and epitaxial growth was started. The gas flow rate, temperature, etc. at the time of epitaxial growth were similar to Example 1. The epitaxial growth film thickness was 10 μm. The surface roughness Ra of the film epitaxially grown in this way was a large 2.5 nm. This is believed to have been an effect of the surface conditions becoming unstable due to stopping the introduction of $SiH_4$ from the end of the etching treatment to the start of the epitaxial growth and the increase in step bunching resulting from the same.

Comparative Example 2

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the $SiH_4$ flow rate at the time of the etching treatment was made 30 cm³ per minute (ratio of $SiH_4$ with respect to hydrogen carrier gas of $2 \times 10^{-2}$ vol %), and the amount of etching by the etching treatment was 0.2 μm (etching time 60 minutes). The rest of the epitaxial growth procedure, gas flow rate, temperature, etc. were similar to Example 1. The epitaxial growth film thickness was 10 μm. The surface roughness Ra of the film epitaxially grown in this way was a large 2.8 nm. This is believed to have been an effect of the formation of Si droplets due to the large amount of flow of $SiH_4$.

Comparative Example 3

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the $SiH_4$ flow rate at the time of the etching treatment was made 0.1 cm³ per minute (ratio of $SiH_4$ with respect to hydrogen carrier gas of $6.7 \times 10^{-5}$ vol %), and the amount of etching by the etching treatment was 0.1 μm (etching time 15 minutes). The rest of the epitaxial growth procedure, gas flow rate, temperature, etc. were similar to Example 1. The epitaxial growth film thickness was 10 μm. The surface roughness Ra of the film epitaxially grown in this way was a large 1.1 nm. Due to the small amount of flow of $SiH_4$ during the etching treatment, the effect of suppression of step bunching could not be seen.

Comparative Example 4

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the $SiH_4$ flow rate at the time of the etching treatment was made 15 cm³ per minute (ratio of $SiH_4$ with respect to hydrogen carrier gas of $10^{-2}$ vol %), and the amount of etching by the etching treatment was 0.05 μm (etching time 15 minutes). The rest of the epitaxial growth procedure, gas flow rate, temperature, etc. were similar to Example 1. The epitaxial growth film thickness was 10 μm. The surface roughness Ra of the film epitaxially grown in this way was a large 2.1 nm. Due to the small amount of etching, the layer with polishing marks of the surface before epitaxial growth was insufficiently removed and therefore the effect of suppression of step bunching could not be seen.

Comparative Example 5

The same procedure was followed as in Example 1 for slicing, rough grinding, normal polishing, and final polishing to obtain a 4 inch (100 mm) SiC single crystal substrate having a 4Hpolytype. Epitaxial growth was performed on the Si surface. The off angle of the substrate was 4°. The procedure of the etching treatment was similar to Example 1, but the $SiH_4$ flow rate at the time of the etching treatment was made 15 cm³ per minute (ratio of $SiH_4$ with respect to hydrogen carrier gas of $10^{-2}$ vol %), and the amount of etching by the etching treatment was 1.0 µm (etching time 300 minutes). The rest of the epitaxial growth procedure, gas flow rate, temperature, etc. were similar to Example 1. The epitaxial growth film thickness was 10 µm. The surface roughness Ra of the film epitaxially grown in this way was a large 2.3 nm. Due to the overly large amount of etching, the surface before epitaxial growth became too great in roughness and therefore the effect of suppression of step bunching could not be seen.

In the above examples, the epitaxial temperature, epitaxial pressure, gas flow rate, and other epitaxial growth conditions were individually changed, but it is also possible to supply the hydrogen carrier gas and silicon-based material gas while simultaneously changing these conditions to start the epitaxial growth. Further, for the material gas, $SiH_4$ gas and $C_3H_8$ gas were used, but it is also possible to use a silicon-based material gas comprised of, for example, $Si_2H_6$, chlorosilane gas, etc. or to use a carbon-based material gas comprised of $C_2H_4$ etc. Furthermore, epitaxial growth is also possible in the state not supplying a doping gas.

INDUSTRIAL APPLICABILITY

According to the present invention, it becomes possible to stably fabricate an epitaxial SiC wafer having a high quality epitaxial film particularly reduced in step bunching in epitaxial growth on a SiC single crystal substrate. Therefore, if forming electronic devices on such a wafer, an improvement in the characteristics and yield of the devices can be expected.

The invention claimed is:

1. A method for producing epitaxial silicon carbide wafers which epitaxially grows silicon carbide by a thermal CVD process on a silicon carbide single crystal substrate in an epitaxial growth furnace, the method for producing epitaxial silicon carbide wafers comprising:
   introducing the silicon carbide single crystal substrate into the epitaxial growth furnace,
   introducing into the epitaxial growth furnace a carrier gas comprised of hydrogen gas and a silicon-based material gas in an amount of $10^{-4}$ vol % to $10^{-2}$ vol % with respect to said carrier gas,
   etching from more than 0.05 µm to 0.5 µm or less of the surface of the silicon carbide single crystal substrate, then
   changing at least one condition in said epitaxial growth furnace while feeding said carrier gas and said silicon-based material gas, and further
   supplying a carbon-based material gas while feeding said carrier gas and said silicon-based material gas after said condition stabilizes to start epitaxial growth of silicon carbide.

2. The method for producing epitaxial silicon carbide wafers according to claim 1 wherein said at least one condition is at least one of an epitaxial growth temperature, epitaxial growth pressure, flow rate of carrier gas, flow rate of silicon-based material gas, or flow rate of carbon-based material gas.

3. The method for producing epitaxial silicon carbide wafers according to claim 1 where said silicon-based material gas is a silane or a chlorosilane-based material gas.

4. The method for producing epitaxial silicon carbide wafers according to claim 1 wherein said carbon-based material gas is one or a mixed gas of two or more of $C_3H_8$ gas, $C_2H_4$ gas, and $CH_4$ gas.

5. The method for producing epitaxial silicon carbide wafers according to claim 1 wherein a surface roughness Ra of the surface of the obtained epitaxial silicon carbide wafer is 1.0 nm or less.

6. The method for producing epitaxial silicon carbide wafers according to claim 1 wherein said silicon carbide single crystal substrate has an off angle to the <11-20> direction with respect to the (0001) face of 4° or less.

7. The method for producing epitaxial silicon carbide wafers according to claim 2 where said silicon-based material gas is a silane or a chlorosilane-based material gas.

8. The method for producing epitaxial silicon carbide wafers according to claim 2 wherein said carbon-based material gas is one or a mixed gas of two or more of $C_3H_8$ gas, $C_2H_4$ gas, and $CH_4$ gas.

9. The method for producing epitaxial silicon carbide wafers according to claim 3 wherein said carbon-based material gas is one or a mixed gas of two or more of $C_3H_8$ gas, $C_2H_4$ gas, and $CH_4$ gas.

10. The method for producing epitaxial silicon carbide wafers according to claim 2 wherein a surface roughness Ra of the surface of the obtained epitaxial silicon carbide wafer is 1.0 nm or less.

11. The method for producing epitaxial silicon carbide wafers according to claim 3 wherein a surface roughness Ra of the surface of the obtained epitaxial silicon carbide wafer is 1.0 nm or less.

12. The method for producing epitaxial silicon carbide wafers according to claim 4 wherein a surface roughness Ra of the surface of the obtained epitaxial silicon carbide wafer is 1.0 nm or less.

13. The method for producing epitaxial silicon carbide wafers according to claim 2 wherein said silicon carbide single crystal substrate has an off angle to the <11-20> direction with respect to the (0001) face of 4° or less.

14. The method for producing epitaxial silicon carbide wafers according to claim 3 wherein said silicon carbide single crystal substrate has an off angle to the <11-20> direction with respect to the (0001) face of 4° or less.

15. The method for producing epitaxial silicon carbide wafers according to claim 4 wherein said silicon carbide single crystal substrate has an off angle to the <11-20> direction with respect to the (0001) face of 4° or less.

16. The method for producing epitaxial silicon carbide wafers according to claim 5 wherein said silicon carbide single crystal substrate has an off angle to the <11-20> direction with respect to the (0001) face of 4° or less.

17. A method for producing epitaxial silicon carbide wafers which epitaxially grows silicon carbide by a thermal CVD process on a silicon carbide single crystal substrate in an epitaxial growth furnace, the method for producing epitaxial silicon carbide wafers comprising:
   introducing the silicon carbide single crystal substrate into the epitaxial growth furnace,
   introducing into the epitaxial growth furnace a carrier gas comprised of hydrogen gas and a silicon-based material gas in an amount of $10^{-4}$ vol % to $10^{-2}$ vol % with respect to said carrier gas at a temperature between 1550° C. and 1600° C., etching from more than 0.05 μm to 0.5 μm or less of the surface of the silicon carbide single crystal substrate, then supplying a carbon-based material gas at a temperature between 1600° C. and 1650° C. while feeding said carrier gas and said silicon-based material gas to start epitaxial growth of silicon carbide.

\* \* \* \* \*